United States Patent
Boescke et al.

(10) Patent No.: US 10,263,135 B2
(45) Date of Patent: Apr. 16, 2019

(54) METHOD FOR PRODUCING A SOLAR CELL INVOLVING DOPING BY ION IMPLANTATION AND DEPOSITING AN OUTDIFFUSION BARRIER

(71) Applicant: INTERNATIONAL SOLAR ENERGY RESEARCH CENTER KONSTANZ E.V., Constance (DE)

(72) Inventors: Tim Boescke, Erfurt (DE); Daniel Kania, Erfurt (DE); Claus Schoellhorn, Frankfurt (DE)

(73) Assignee: ION BEAM SERVICES, Peynier (FR)

( * ) Notice: Subject to any disclaimer, the term of this patent is extended or adjusted under 35 U.S.C. 154(b) by 0 days.

(21) Appl. No.: 15/021,077

(22) PCT Filed: Aug. 5, 2014

(86) PCT No.: PCT/EP2014/066856
§ 371 (c)(1),
(2) Date: Mar. 10, 2016

(87) PCT Pub. No.: WO2015/036181
PCT Pub. Date: Mar. 19, 2015

(65) Prior Publication Data
US 2016/0233372 A1   Aug. 11, 2016

(30) Foreign Application Priority Data
Sep. 13, 2013 (DE) .................. 10 2013 218 351

(51) Int. Cl.
*H01L 31/18* (2006.01)
*H01L 21/265* (2006.01)
(Continued)

(52) U.S. Cl.
CPC .... *H01L 31/1804* (2013.01); *H01L 21/26513* (2013.01); *H01L 31/02167* (2013.01);
(Continued)

(58) Field of Classification Search
CPC .......... H01L 21/26513; H01L 31/1804; H01L 31/02167; H01L 31/1864; H91L 31/068; Y02E 10/521
See application file for complete search history.

(56) References Cited

U.S. PATENT DOCUMENTS

| 4,577,393 A | 3/1986 | Schmidt |
| 2004/0112426 A1* | 6/2004 | Hagino ............. H01L 31/02242 136/261 |

(Continued)

FOREIGN PATENT DOCUMENTS

| EP | 2490268 A1 | 8/2012 |
| EP | 2677546 A1 | 12/2013 |
| WO | 2013/109466 A1 | 7/2013 |

OTHER PUBLICATIONS

International Search Report for PCT/EP2014/066856 dated Oct. 29, 2014.

(Continued)

*Primary Examiner* — Caridad Everhart
(74) *Attorney, Agent, or Firm* — Sughrue Mion, PLLC

(57) ABSTRACT

The invention relates to a method for producing a solar cell (1) from crystalline semiconductor material, wherein a first doping region (5) is formed by means of ion implantation (S2) of a first dopant in a first surface (3a) of a semiconductor substrate (3), and a second doping region (7) is formed by means of ion implantation (S3) or thermal indiffusion of a second dopant in the second surface (3b) of the semiconductor substrate. After the doping of the second surface, a cap (9b) acting as an outdiffusion barrier for the second dopant is applied and an annealing step (S4) is subsequently carried out.

11 Claims, 6 Drawing Sheets

Figure 1:
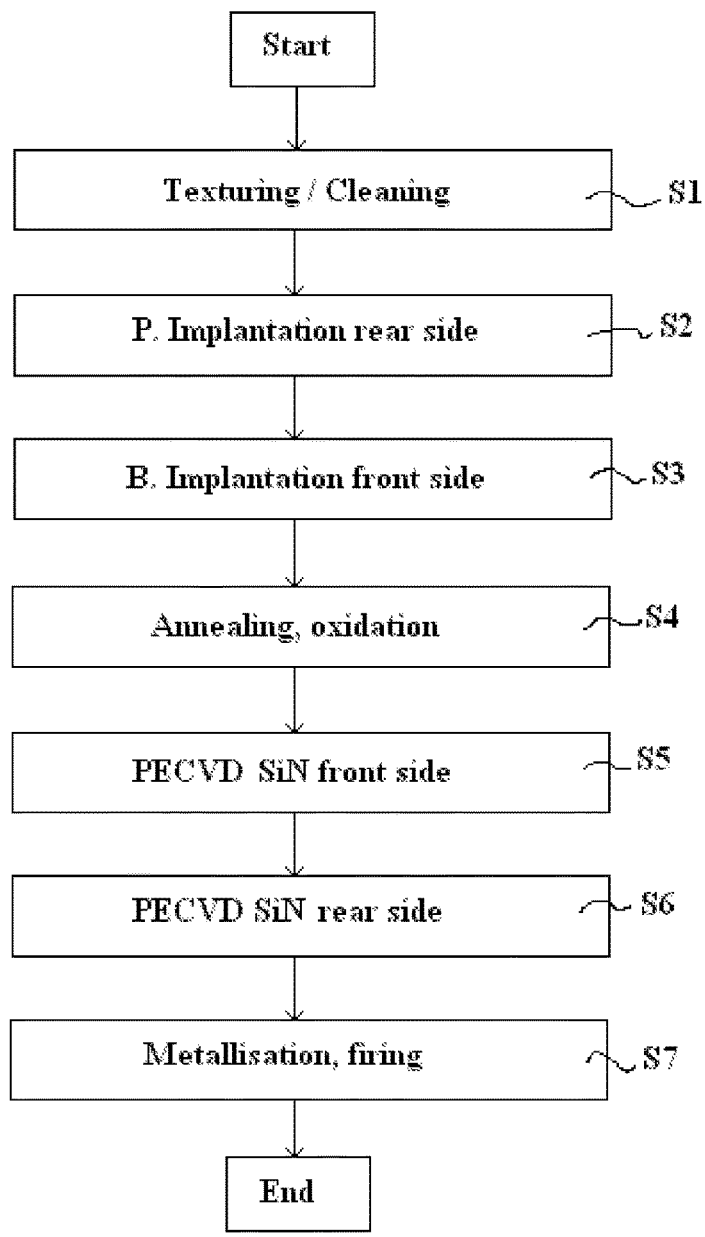

(51) Int. Cl.
H01L 31/0216 (2014.01)
H01L 31/068 (2012.01)
(52) U.S. Cl.
CPC ........ H01L 31/068 (2013.01); H01L 31/1864 (2013.01); *Y02E 10/547* (2013.01); *Y02P 70/521* (2015.11)

(56) References Cited

U.S. PATENT DOCUMENTS

| | | | | |
|---|---|---|---|---|
| 2006/0060238 A1* | 3/2006 | Hacke | .................. | H01L 31/068 136/256 |
| 2012/0199202 A1* | 8/2012 | Prajapati | ............ | H01L 31/1804 136/261 |
| 2014/0060629 A1* | 3/2014 | Lai | .................... | H01L 31/02363 136/255 |
| 2014/0261666 A1* | 9/2014 | Stewart | ............. | H01L 31/02242 136/256 |
| 2014/0370650 A1* | 12/2014 | Moslehi | .................. | H01L 31/18 438/98 |
| 2015/0243804 A1* | 8/2015 | Thaidigsmann | .. | H01L 31/02167 136/256 |

OTHER PUBLICATIONS

S. Mack et al, "Towards 19% efficient industrial PERC devices using simultaneous front emitter and rear surface passivation by thermal oxidation", 35$^{th}$ IEEE Photovoltaic Specialist Conference (PVSC) Jun. 20-25, 2010, Honolulu, HI, USA< IEEE, Piscataway, NJ, USA, Jun. 20, 2010, pp. 34-38, XP031783873.

* cited by examiner

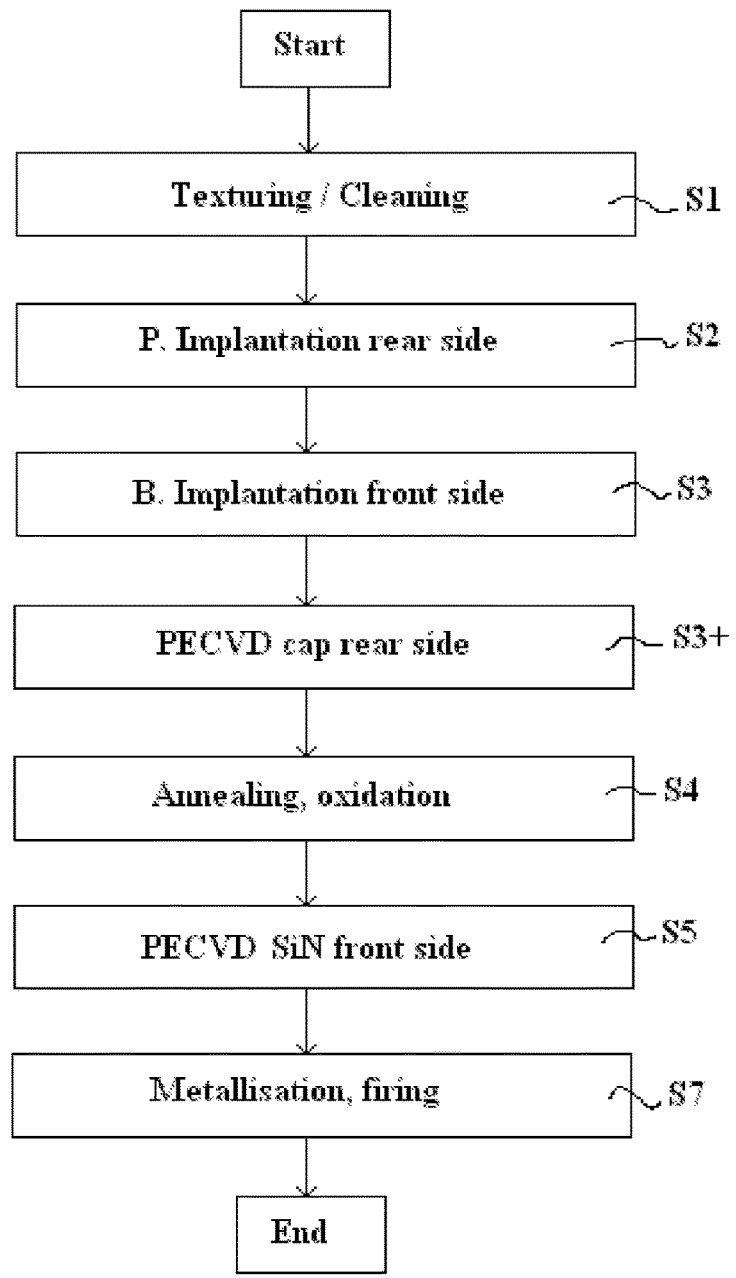

METHOD FOR PRODUCING A SOLAR CELL INVOLVING DOPING BY ION IMPLANTATION AND DEPOSITING AN OUTDIFFUSION BARRIER

CROSS REFERENCE TO RELATED APPLICATIONS

This application is a National Stage of International Application No. PCT/EP2014/066856, filed on Aug. 5, 2014, which claims priority based on German Patent Application No. 10 2013 218 351.8, filed on Sep. 13, 2013, the contents of all of which are incorporated herein by reference in their entirety.

The invention concerns a method for producing a solar cell from crystalline semiconductor material, wherein in a first surface of a semiconductor substrate a first doping region is formed by ion implantation of a first dopant and in the second surface of the semiconductor substrate a second doping region is formed by ion implantation or thermal indiffusion of a second dopant.

STATE OF THE ART

Solar cells based on mono or polycrystalline semiconductor material, in particular silicon, constitute in spite of the development and the launching of the market of new generations of solar cells, such as thin film and organic solar cells, the largest portion, by far, of the electric energy recovered by photovoltaic conversion of energy. Crystalline silicon solar cells have also seen recently important new developments, among which the solar cells of the type aforementioned (especially the so-called n-PERT solar cells).

To increase the efficiency of industrial solar cells, the development of solar cells will be boosted with phosphorus and boron doped regions. A prominent example consists of bifacial n-type solar cells containing a boron doped emitter on the front side and a phosphorus doped Back Surface Field (BSF) on the rear side of the cell.

DISCLOSURE OF THE INVENTION

In particular when the doped regions are contacted with a screen print metallisation, it is desirable to adjust different doping profiles for both dopants. The boron profile should be relatively deep at a low surface concentration while the phosphorus profile should be rather flat with a higher surface concentration. This is conditioned by a different contacting behaviour of the commercially available metallisation pastes.

An optimisation application consists in using enhanced doping techniques such as ion implantation. This method enables one-sided application of dopants into a semiconductor substrate or the application of different dopants in both main surfaces thereof. A flow chart for the production of a double-sided doped solar cell is represented in FIG. 1. As the figure is self-explanatory, there is no need for a more detailed description. In such a case, the ion implantation in steps S2 and S3 is followed by an annealing or curing step S4 in which additionally a thin oxide layer is grown on the wafer surface. Said oxide layer forms together with a SiN cap deposited later in steps S5 or S6 a passivation stack.

The experiments of the inventors have shown that the practical application was problematic. The efficiency of the solar cells produced with this method depends to a vast extent on those solar cells manufactured with a more complex process flow.

This is due among other things to the following effects: the curing of the implanted boron emitter requires an annealing step at very high temperature ($>1000°$ C.) in inert atmosphere. These conditions are not ideal for the curing of the phosphorus Back Surface Field (BSF). The phosphorus diffuses very deeply into the substrate due to the high temperature. This leads to increased Free-Carrier-Absorption which lowers the quantum efficiency of the cell. Moreover, the superficial phosphorus evaporates. This loss of doping agent leads in turn to an increase in contact resistance on the rear side of the cell and may cause short-circuits between emitter and BSF further to a so-called autodoping.

The invention enables to provide a method with the features of claim 1. Appropriate developments of the inventive concept are the object of the dependent claims.

The aim of the invention is to take precautionary measures before performing the annealing step (high temperature curing) to at least limit and/or compensate for the negative effects of the phosphorus doping region aforementioned. It is therefore suggested to deposit, onto the second surface, caps acting as an outdiffusion barrier for the second dopant.

The invention thus enables to solve the problem aforementioned by depositing a cap onto the rear side of the solar cell after implantation of the BSF and before the curing step. The cap prevent the outdiffusion of phosphorus. A cap impermeable to oxygen can also be used in one embodiment thereby preventing a so-called oxidation-enhanced-diffusion (OED) on the rear side of the cell. These measures enable to provide a BSF-profile without the shortcomings mentioned above. Similarly, an appropriate masking can prevent autodoping. In a further embodiment, a layer can be deposited which injects vacancies into the silicon during the annealing step. These vacancies will further slow down the diffusion of phosphorus. This process may entail a covering layer under tensile stress and/or a substoichiometric covering layer.

In this embodiment, preferred from this point of view, the cap applied onto the second surface is left as an anti-reflection/passivation layer of the solar cell or portion thereof on the second surface. Consequently, there is no additional process complexity. Its feasibility is surprising to a certain extent since the usual hypothesis is that one layer of the type in question here (especially a layer formed by PECVD) which would be degraded in terms of passivation properties during one of the subsequent high temperature step and would become largely unusable as a passivation layer. It is provided in an alternative embodiment that the cap applied onto the second surface is etched back after the annealing step. In this embodiment, a special passivation layer is again applied after back-etching.

As already mentioned, in another configuration, the cap applied onto the second surface is deposited by means of a PECVD method. Alternately, PVD or APCVD or similar methods for producing the cap can be used. Those skilled in the art will deduce a more specific embodiment according to the method, from the material parameters of the concrete layer and from the parameters of the subsequent thermal step, taking into consideration the doping parameters of the second dopant, without requiring more detailed description.

Details of exemplary embodiments are mentioned below.

In preferred embodiments in terms of material, the cap applied onto the second surface contains a silicon oxide and/or silicon nitride layer and/or a silicon nitride oxide layer. The cap can also be designed in such a way that it contains several partial layers, from which at least one is formed as a silicon nitride layer.

The invention described above is extremely relevant today for solar cells in which silicon is used as a semiconductor material, an element selected among the group comprising boron, indium, gallium, aluminium, especially boron, is used as the first dopant, and an element selected among the group comprising phosphorus, arsenic, antimony, especially phosphorus, is used as the second dopant. More specifically, we are dealing here with solar cells in which the first doping region is formed as the emitter region in the front surface of an n-silicon substrate and the second doping region is formed as a Back Surface Field in the rear surface of the n-silicon substrate.

In particular in such a material/dopants configuration, it is provided that the annealing step contains a curing step at a temperature in the range between 850° C. and 1100° C. in neutral or oxidising atmosphere. Basically, it may prove reasonable according to the invention to provide a cap even with thermal process steps designed primarily as diffusion steps and in conjunction with another process atmosphere (possibly an atmosphere containing dopants).

DRAWINGS

Figure 2B:
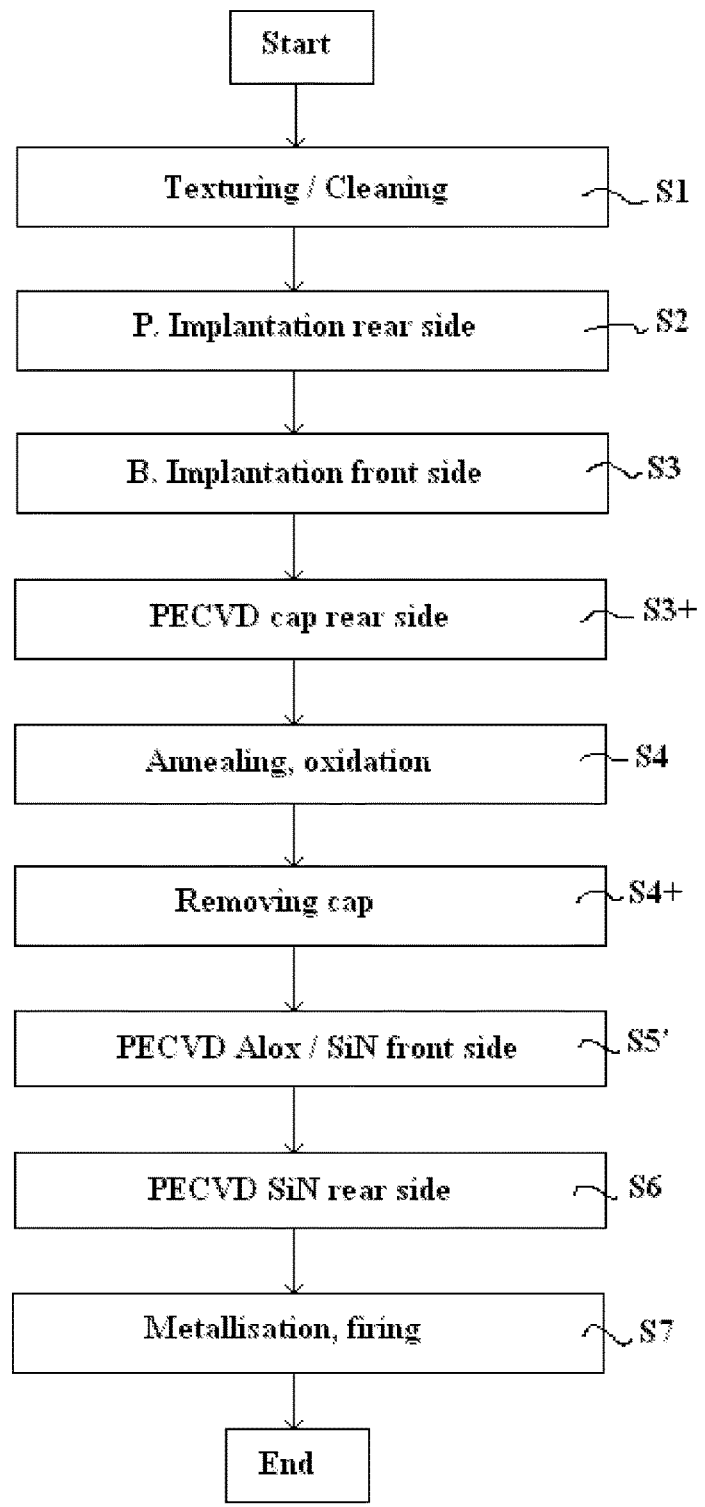

The invention will be described below more in detail using an exemplary embodiment with reference to the diagrammatical drawings appended. Wherein:

FIG. 1 shows a diagrammatical flow chart of a known method for producing a crystalline solar cell, FIGS. 2A and 2B show diagrammatical of two embodiments of the method according to the invention and FIG. 3A to 3E show cross-sectional illustrations of a silicon substrate or of a solar cell produced therefrom in different steps of production of an embodiment by way of example.

FORMS OF EMBODIMENT OF THE INVENTION

FIG. 2A shows diagrammatically in a flow chart important steps of the production of a crystalline solar cell in one embodiment of the method according to the invention, whereas the representation is again rather self-explanatory. With respect to the previous process flow shown in FIG. 1, a cap is provided on the rear side of the substrate by means of PECVD (step S3+) after the steps of phosphorus implantation into the rear side of the substrate and of boron implantation into the front side of the substrate (S3), followed in standard sequence by an annealing (step S4) connected to the oxidation of the substrate surface. The cap produced in step S3+ remains as an anti-reflection/passivation layer on the substrate so that the step S6 of the standard process sequence is here dispensed with.

In contrast thereto the sequence sketched in FIG. 2B sets forth the generation of a cap on the rear side of the substrate in step S3+ which will be removed again after the annealing step S4 in an additional step S4+ and in the standard process sequence an SiN anti-reflection/passivation layer will be applied again onto the rear side of the substrate by means of PECVD. Incidentally, the step of generating an operationally similar layer on the front side of the substrate (S5') is modified as appropriate so that an aluminium oxide/silicon nitride layer construction is applied onto the front side of the substrate, instead of an SiN layer.

Figure 3A:
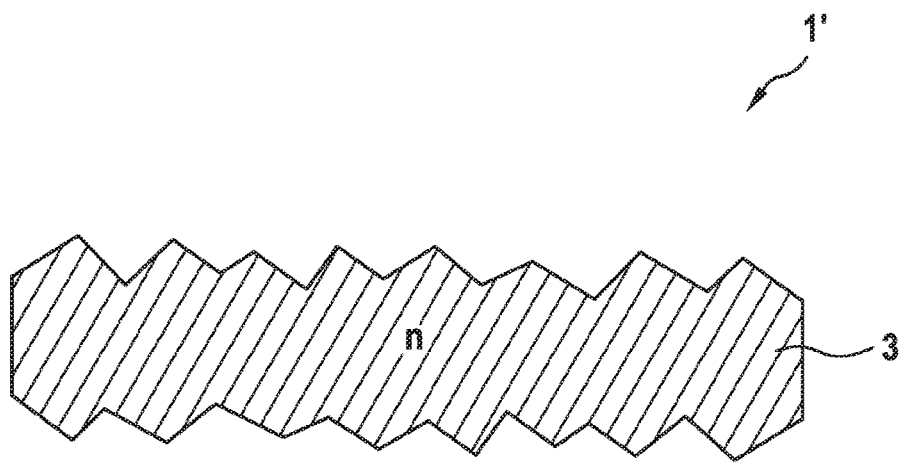
Figure 3B:
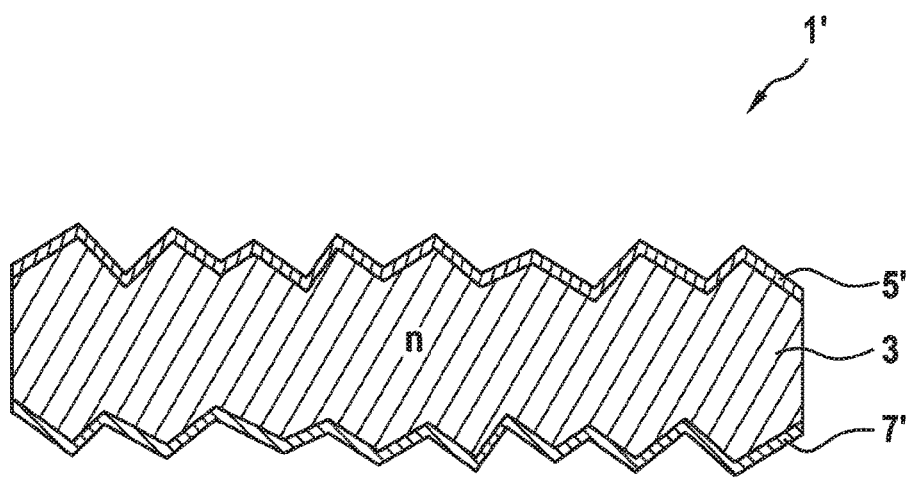
Figure 3C:
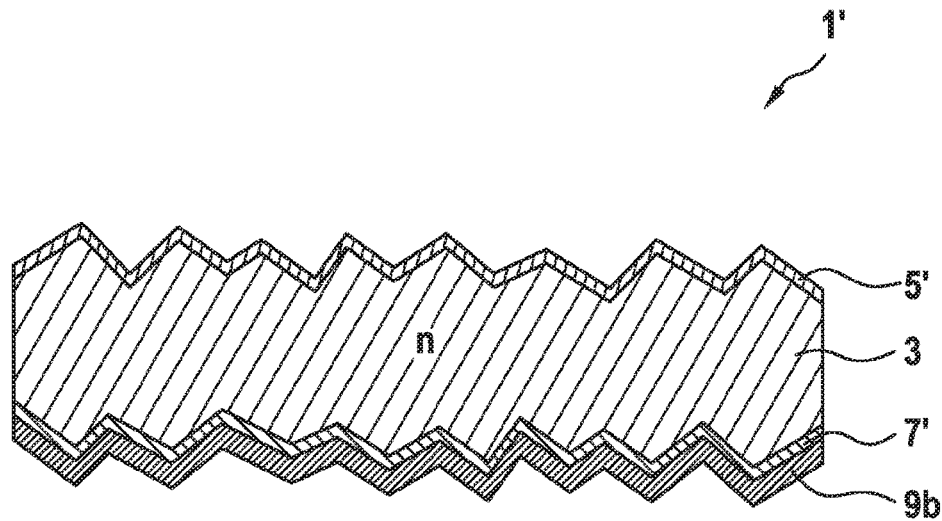
Figure 3D:
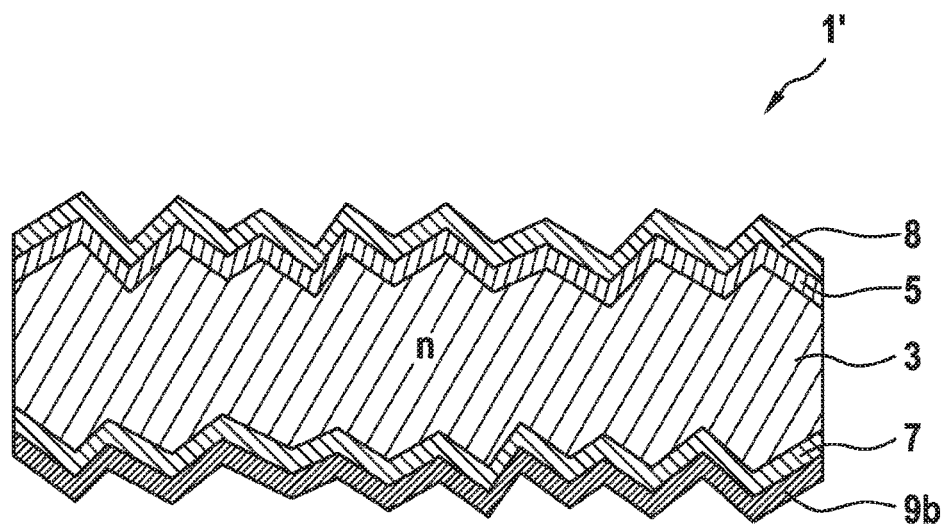
Figure 3E:
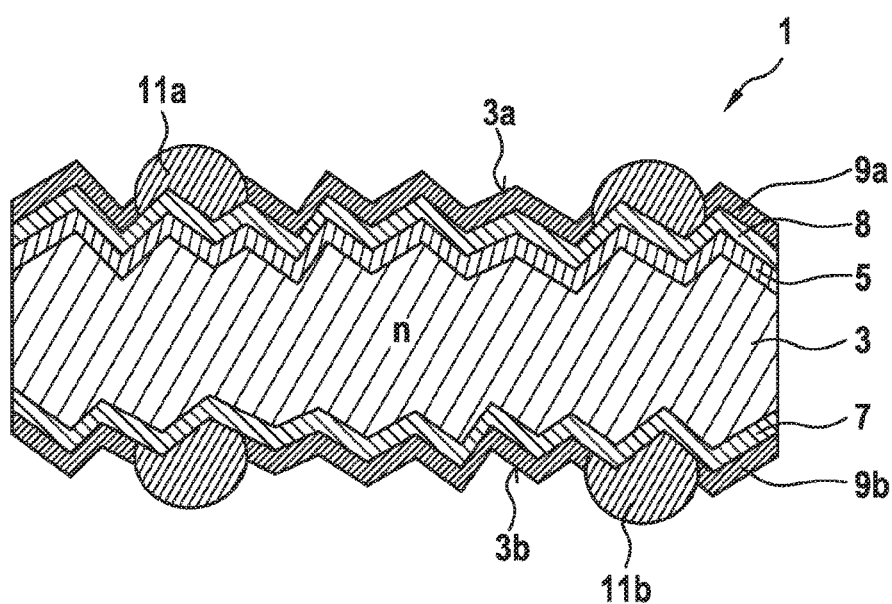

FIG. 3A to 3E show the construction of a solar cell produced by means of the method according to the invention, as well as important phases of their production in diagrammatical cross-sectional representations, whereas FIG. 3E the solar cell 1 produced with respect to the process sequence of interest here.

FIG. 3E shows diagrammatically in a cross-sectional representation a solar cell 1 with a crystalline silicon substrate 3 of n-type and of a respective pyramidal structured first (front side) surface 3a and second (rear side) surface 3b. In the first surface 3a, a first doping region (emitter region) 5 is formed by boron diffusion and in the second surface, a flat Back Surface Field 7 is formed as the second doping region by phosphorus implantation and subsequent curing/activation. A thermal silicon oxide layer 8 can be seen on the front side during the curing/activation step (annealing step).

A thick silicon nitride layer 9a or 9b is systematically deposited on the first and second surfaces 3a, 3b as an anti-reflection layer. The anti-reflection layer can be added a further partial layer out of oxide (for example silicon oxide), which improves the passivation properties of the layer, but which is not shown in the figure. The front side of the solar cells (first surface) 3a exhibits a front side metallisation 11a and the rear side of the solar cells (second surface) 3b a rear side metallisation 11b.

FIG. 3A shows diagrammatically an n-silicon substrate 1', textured and cleaned on both sides, after process step S1; FIG. 3B shows the texture solar cell substrate 1' with a front side (initial) boron implantation region 5' and a rear side phosphorus implantation region 7' after process step S3; FIG. 3C shows the situation after deposition of the rear side cap 9b in step S3+; and FIG. 3D shows the situation after the annealing step S4, whereas both doping regions 5, 7 are enlarged in the depth direction and a thermal oxide 8 is grown on the front surface.

We shall now complement the above brief representation for the main process steps with comments and tips in terms of variations and alternatives.

S1: Texturing/Cleaning

This process step may entail an industry standard texturing with subsequent cleaning. Optionally, the wafer can be planed on the rear side. To do so, several methods are provided by the state of the art and are not relevant for this invention.

S2: Boron Implantation

Implantation of boron into the front side of the cell, for example a dose between 0.5 and 5e15 $1/cm^2$ with an energy of 1-40 keV, preferably 1.5-3e15 $1/cm^2$, 3-10 keV). The layer resistance of the boron layer is after curing 30-300 Ohm/square; preferably 60-100 Ohm/square. In a further embodiment, the implantation can be selective so that the dose is higher under the metallisation region.

The boron implantation can also take place after deposition of the rear side cap (between S3+ and S4). This can prove advantageous to prevent any mechanical damage of the implanted region during cap deposition.

S3: Phosphorus Implantation

Here, phosphorus is implanted into the rear side of the cell (for instance a dose between 0.5 and 5e15 $1/cm^2$ with an energy of 1-40 keV, preferably 2.5-4e15 $1/cm^2$, 10 keV). The layer resistance of the phosphorus layer is after curing 10-300 Ohm/square; preferably 30-120 Ohm/square. In a further embodiment, the implantation can be selective so that the dose is higher under the metallisation region.

S3+: Cap on the Rear Side

The cap on the rear side prevents the outdiffusion of phosphorus and optionally the indiffusion of oxygen. In the embodiment variation according to FIG. 2A, the cap remains on the cell and is used as passivation on the rear side.

In the simplest embodiment, the cap is a pure $SiO_2$ (n=1.4-1.6, preferably n=1.46) or a pure SiN layer (n=1.8-2.2, preferably 1.9-2). Optionally, the use of SiON is possible (n=1.46-2.2) so as to obtain ideal passivation and permeability to oxygen by adjusting the variation of the oxygen and nitrogen content. The thickness of the layer ranges between 1 nm and 250 nm, preferably 30-80 nm.

Normally, the cap layer is deposited by a PECVD process with a chemical selected among one or several gases from the group containing $SiH_4$, $N_2O/O_2/CO_2$, $NH_3$, $N_2$, Ar. Due to the deposition process, the layers have a water content lower than 15%, which is due to the annealing step (5). Alternately, the cap layer can be applied using other methods, such as for example APCVD or PVD.

For optimisation of all requirements, a layer stack can be used, such as for instance an $SiO_2/SiN_2$ layer stack or a layer composed of two SiN layers with different refractive indices. The success of the process depends mainly on the application of the rear side cap.

The deposition of the cap can be followed by an optimal cleaning step, so as to eliminate any particles and possible contamination. This can be performed wet-chemically in a water-based bath with one or several process chemicals HF, HCl, $H_2O_2$.

S4: Annealing

The thermal post-treatment step cures the implantation damages, activates the implanted dopants and diffuses boron and phosphorus into the wafer so as to obtain the desired depth of emitter and BSF. The annealing process adheres to the requirements to activate the boron, which is far more critical than phosphorus. The activation of boron normally requires annealing at high temperature (900-1100° C.) in inert atmosphere ($N_2$, Ar). In chronological partial steps, oxygen can be injected to grow an oxide layer on the wafer surface and to accelerate the boron diffusion through OED effect. The annealing process lasts between 5 and 300 minutes, preferably between 15 and 60 minutes. The oxide layer grown during the annealing process enables later passivation and its thickness can range between 1 and 150 nm, preferably 5 and 25 nm. The depths of the diffusion regions range between 30 and 2500, preferably 400 and 1 000 nm.

Alternately, a Rapid Thermal Anneal (RTA) step can be contemplated, during which the cell can be heated for a very short time at a very high temperature (above 1000° C.).

S5: Front Side Passivation

In the simplest embodiment, the front side passivation of the solar cell is carried out with an SiO/SiN. To do so, the thermally grown silicon oxide ($SiO_2$) of step S4 is used. The SiN is deposited via a PECVD process. This variation is attractive due to the low costs of the process. The SiN normally has a refractive index between 1.98 and 2.15 (preferably 2.05) and is deposited with a thickness between 10 and 150 nm (preferably 60-90 nm).

Alternately, an $Al_2O_3$/SiN layer stack can be used for the front side passivation. To do so, the $SiO_2$ on the front side must be removed selectively. This may involve for instance a wet etching step with HF.

S7: Metallisation

Metallisation can use standard industry methods and is not important for the invention. The front side metallisation is carried out normally with a silver grid and the rear side metallisation also with a silver grid or a full surface aluminium metallisation with local contacts, produced for instance by laser ablation and PVD.

In a more specialised context known to those skilled in the art, further embodiments and variations can be contemplated on the basis of the method and device shown here purely by way of illustration. It should be borne in mind that the invention can be used on other solar cell concept with boron and phosphorus implantation, such as for instance MWT-nPERT cells, p-type PERT cells and so on.

The invention claimed is:

1. A method for producing a solar cell from crystalline semiconductor material, wherein in a first surface of a semiconductor substrate a first doping region is formed by ion implantation of a first dopant and in a second surface of the semiconductor substrate a second doping region is formed by ion implantation or thermal indiffusion of a second dopant, wherein said method further comprises the steps of, after doping of the second surface, applying onto the second surface a cap acting as an outdiffusion barrier for the second dopant, followed by an annealing step,
    wherein the cap applied onto the second surface is formed in such a way that it is impermeable to oxygen due to its composition, nature and thickness.

2. The method of claim 1,
    wherein the cap applied onto the second surface is left as an anti-reflection/passivation layer of the solar cell or portion thereof on the second surface.

3. The method of claim 1,
    wherein the cap applied onto the second surface is etched back after the annealing step.

4. A method according to claim 1,
    wherein the cap applied onto the second surface is deposited by means of a PECVD process.

5. A method according to claim 1,
    wherein the cap is formed before the ion implantation of the first dopant into the first surface.

6. A method according to claim 1,
    wherein the semiconductor material is silicon, the first dopant is an element from the group incorporating boron, indium, gallium, aluminium, in particular boron, and the second dopant is an element from the group incorporating phosphorus, arsenic, antimony, in particular phosphorus.

7. A method according to claim 1,
    wherein the first doping region is formed as an emitter region in the front surface of an n-silicon substrate and the second doping region is formed as a back surface field in the rear surface of the n-silicon substrate.

8. A method according to claim 1,
    wherein the annealing step contains a curing step at a temperature in the range between 850° C. and 1100° C. in neutral or oxidising atmosphere.

9. A method according to claim 1,
    wherein the cap applied onto the second surface contains a silicon oxide and/or a silicon nitride layer and/or a silicon oxide nitride layer.

10. The method of claim 9,
    wherein the cap contains several partial layers one of which at least is formed as a silicon nitride layer.

11. A method for producing a solar cell from crystalline semiconductor material, wherein in a first surface of a semiconductor substrate a first doping region is formed by ion implantation of a first dopant and in a second surface of the semiconductor substrate a second doping region is formed by ion implantation or thermal indiffusion of a second dopant, wherein said method further comprises the steps of, after doping of the second surface, applying onto the second surface a cap acting as an outdiffusion barrier for the second dopant, followed by an annealing step, wherein the cap applied onto the second surface is etched back after the annealing step.

* * * * *